United States Patent
Asakawa et al.

(10) Patent No.: US 7,872,540 B2
(45) Date of Patent: Jan. 18, 2011

(54) OSCILLATOR DEVICE AND TRANSMITTER MODULE USING SAME

(75) Inventors: Yasuteru Asakawa, Osaka (JP); Naoki Yuda, Osaka (JP); Eiji Okada, Osaka (JP); Akira Fujishima, Osaka (JP); Masatoshi Homan, Tokyo (JP)

(73) Assignees: Matsushita Electric Industrial Co., Ltd., Osaka (JP); Olympus Medical Systems Corp., Tokyo (JP)

(*) Notice: Subject to any disclaimer, the term of this patent is extended or adjusted under 35 U.S.C. 154(b) by 255 days.

(21) Appl. No.: 11/961,572

(22) Filed: Dec. 20, 2007

(65) Prior Publication Data

US 2009/0184776 A1   Jul. 23, 2009

(51) Int. Cl.
*H03B 5/08* (2006.01)
(52) U.S. Cl. ............ 331/167; 331/107 R; 331/117 R; 331/36 C
(58) Field of Classification Search ........ 331/36 C, 331/36 L, 108 C, 108 D, 167, 117 R, 181
See application file for complete search history.

(56) References Cited

U.S. PATENT DOCUMENTS

| 6,404,315 B1* | 6/2002 | Maruyama ............ 336/192 |
| 2004/0155715 A1* | 8/2004 | Nakamura et al. ........ 331/158 |

FOREIGN PATENT DOCUMENTS

JP    H03-049303    3/1991

* cited by examiner

*Primary Examiner*—Joseph Chang
*Assistant Examiner*—Jeffrey Shin
(74) *Attorney, Agent, or Firm*—Scully, Scott, Murphy & Presser, P.C.

(57) ABSTRACT

An oscillator device includes a resonator including a coil and a capacitor connected to the coil in parallel; and an oscillator connected to the resonator. Electric waves are emitted from the coil to at least one receiving antenna of the receiver while the oscillator device changes position and direction over time. The coil has an outer diameter and a total length which is approximately the same as the outer diameter.

9 Claims, 10 Drawing Sheets

OSCILLATOR DEVICE AND TRANSMITTER MODULE USING SAME

BACKGROUND OF THE INVENTION

1. Field of the Invention

The present invention relates to an oscillator device used in, for example, an endoscope, and a transmitter module using the oscillator device.

2. Description of the Related Art

There is a known inspection device for looking inside the patient's body. The inspection device includes a very small oscillator device, which is swallowed by the patient, and a receiving antenna, which is provided outside the patient's body and receives electric waves emitted from the oscillator device.

Such an oscillator device has generally a directional transmitting antenna since it is needed to have a very small size. The oscillator device, which travels in the patient's body, changes its position and direction over time. Accordingly, a receiving device has multiple receiving antennas to receive directional electric waves emitted from various positions and directions. Specifically, the receiving antennas are attached on the patient in different directions so as to receive electric waves emitted from all directions.

For example, Japanese Patent Application Laid-open No. H3-49303 discloses an oscillator circuit related to the above oscillator device.

Figure 10:
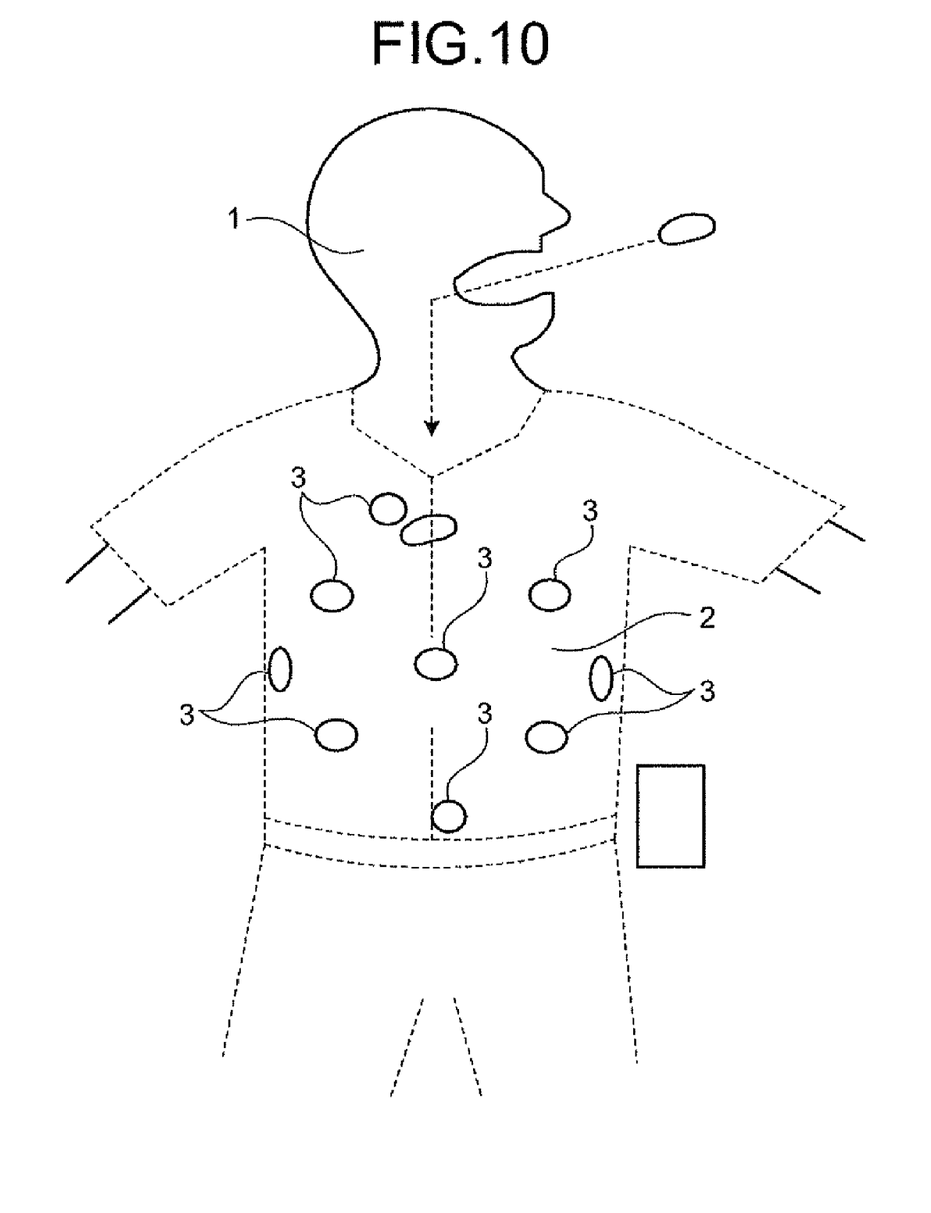
FIG. 10 shows an arrangement of a medical system using a convention oscillator device on the patient.

As described above, the receiving device, if having a few receiving antennas, is difficult to receive electric waves with homogeneous strength from the directional transmitting antenna of the conventional oscillator device. To overcome this problem, an approach is that multiple receiving antennas 3 are arranged around the organs 2 of the patient 1, as shown in FIG. 10. However, this arrangement increases the burden on the patient.

SUMMARY OF THE INVENTION

An oscillator device according to one aspect of the present invention includes a resonator including a coil and a capacitor connected to the coil in parallel; and an oscillator connected to the resonator. Electric waves are emitted from the coil to at least one receiving antenna of the receiver while the oscillator device changes position and direction over time. The coil has an outer diameter and a total length which is approximately the same as the outer diameter.

A transmitter module according to another aspect of the present invention includes an oscillator device; a phase-locked loop circuit connected to the oscillator device; and a data input terminal. The oscillator device includes a resonator including a coil and a variable capacitance diode connected to the coil in parallel, the variable capacitance diode being connected to the data input terminal; an oscillator connected to the resonator; and an insulating board, the insulating board having one side on which the coil is mounted and the other side on which the capacitor and the oscillator are mounted. Electric waves are emitted from the coil to at least one receiving antenna of the receiver while the oscillator device changes position and direction over time. The coil has an outer diameter and a total length which is approximately the same as the outer diameter.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the invention will be described below with reference to the drawings.

Figure 1:
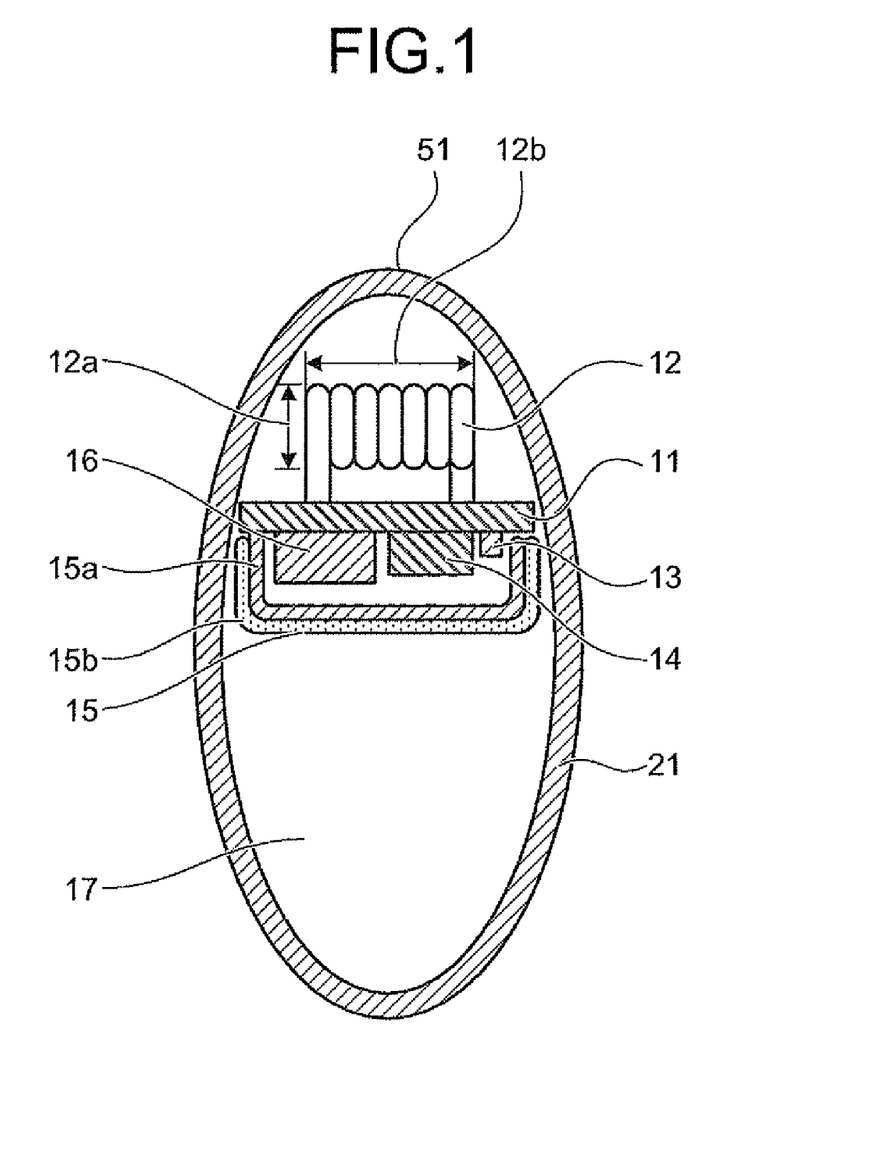
FIG. 1 is a cross-sectional view of a transmitter capsule including an oscillator device according to a first embodiment of the present invention.

FIG. 1 is a cross-sectional view of a transmitter capsule including an oscillator device according to a first embodiment of the present invention. The transmitter capsule 51 has a capsule housing 21, which includes therein an insulating board 11, a coil 12 mounted on one side of the insulating board 11, a capacitor 13, an oscillator 14, and a PLL (Phase-Locked Loop) circuit 16. The coil 12 has an outer diameter 12a and a total length 12b which is approximately the same as the outer diameter 12a. The coil 12 has also two terminals which are led to the other side of the insulating board 11 to be connected to the capacitor 13 in parallel. The coil 12 and the capacitor 13 constitute a resonator 31 (see FIG. 5). The resonator 31 and the oscillator 14 are connected to each other to constitute an oscillator device 30. The oscillator device 30 and the PLL circuit 16 are connected to each other to constitute a transmitter module 40. The PLL circuit 16 will be described later with reference to FIG. 6.

A separator 15 covers the transmitter module 40, except for the coil 12, to prevent high-frequency noise from passing between the transmitter module 40 and a space 17. A camera 19 and a controller 18 are provided in the space 17 (see FIG. 7). The controller 18 is connected to an output terminal of the camera 19 and controls the transmitter module 18.

The separator 15 includes a nickel silver 15a serving as a conductor and a resin 15b serving as an insulator. The resin 15b is applied to the nickel silver 15a.

The nickel silver 15a, which is a core material of the separator 15, makes it possible to form a thin, strong separator. The nickel silver 15a, which is also conductive, makes it possible to prevent high-frequency interference between the transmitter module 40 and the controller 18.

The resin 15b, which is applied to the nickel silver 15a, makes it possible to provide high insulation performance, resulting in a small distance between components across the separator 15. This means a reduction in the size of the transmitter capsule 51.

Figure 2:
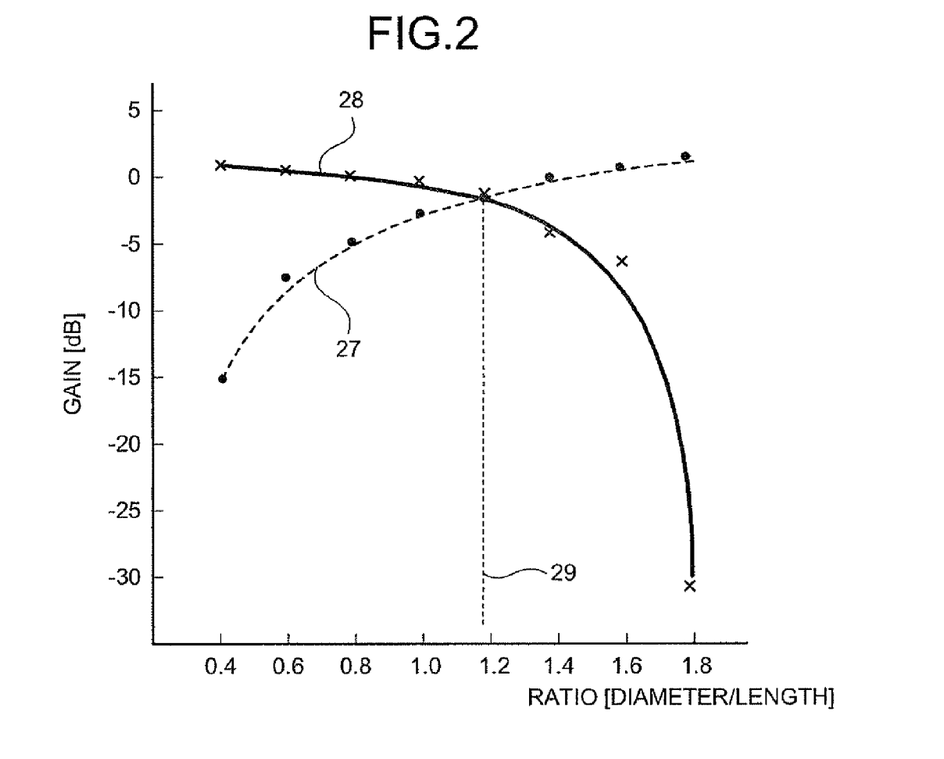
FIG. 2 is a graph of gain vs. ratio of outer diameter to length of a coil used in the oscillator device.

FIG. 2 shows a simulation result of gain (dB) obtained in a receiving device when the receiving device receives, through receiving antennas, electric waves (vertically-polarized waves and horizontally-polarized waves) emitted from the coil 12. The abscissa axis represents the ratio of outer diameter 12a to total length 12b of the coil 12. The ordinate axis represents the gain (dB) of the receiving antennas.

Referring to FIG. 2, the curve 27 represents receiving levels of the receiving antennas located perpendicular to the winding direction of the coil 12, and the receiving levels are of the vertically-polarized component. The curve 28 represents receiving levels of the receiving antennas located in parallel to the winding direction, and the receiving levels are of the horizontally-polarized component.

As shown in FIG. 2, if the ratio of the outer diameter 12a to the total length 12b of the coil 12 is small, in other words, if the coil 12 is like a solenoid coil, homogeneous magnetic fields are emitted from the coil 12, resulting in increased receiving levels of the vertically-polarized component.

To the contrary, if the ratio of the outer diameter 12a to the total length 12b of the coil 12 is large, inhomogeneous magnetic fields are emitted from the coil 12, resulting in increased emission at both terminals of the coil 12. Accordingly, the receiving levels of the horizontally-polarized component are increased, and the receiving levels of the vertically-polarized component are reduced.

If the outer diameter 12a of the coil 12 is approximately the same as the total length 12b, the vertically-polarized waves and the horizontally-polarized waves are emitted from the coil 12 with approximately the same levels. This means a low directivity and allows reduction in the number of receiving antennas for receiving such electric waves. In the first embodiment, a good result is obtained at a ratio of outer diameter 12a to total length 12b of about 1.2 (see the dashed line 29 of FIG. 2). This ratio is preferably set in a range of about 1 to 1.4.

Figure 3A:
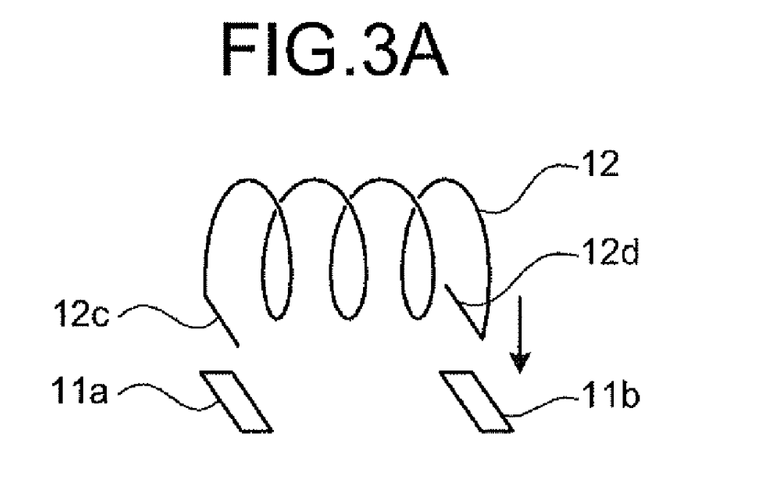
FIG. 3A is a perspective view of the coil.
Figure 3B:
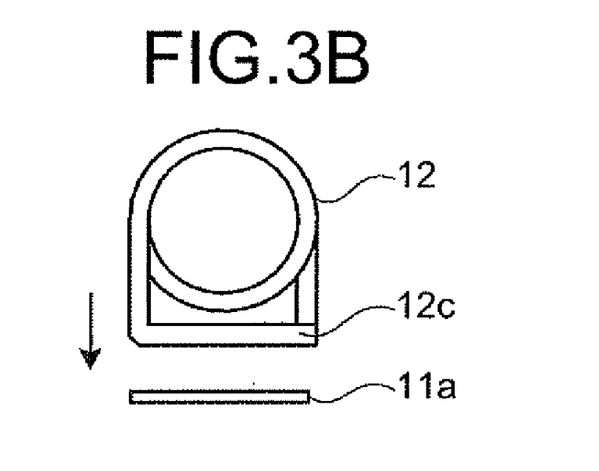
FIG. 3B is a side view of the coil.

The following is the structure of the coil 12. The coil 12 preferably has a circular shape to have a low directivity. Referring to FIGS. 3A and 3B, the end portions 12c and 12d of the coil 12 are bent under the coil 12 at right angles so as to be perpendicular to the winding axis of the coil 12. Lands 11a and 11b, where the end portions 12c and 12d are soldered, respectively, are also provided along the directions of the end portions 12c and 12d. The lands 11a and 11b are formed on the top surface of the insulating board 11. In this configuration of the coil 12, the directions of magnetic flux of the end portions 12c and 12d are the same as the direction of magnetic flux of the coil 12. This results in effective emission of electric waves.

For example, the outer diameter 12a of the coil 12 is 3.4 mm, and the total length 12b is 3.0 mm. The wire size of the coil 12 is 0.4 mm, and the winding number is 5.5, for example.

Figure 4A:
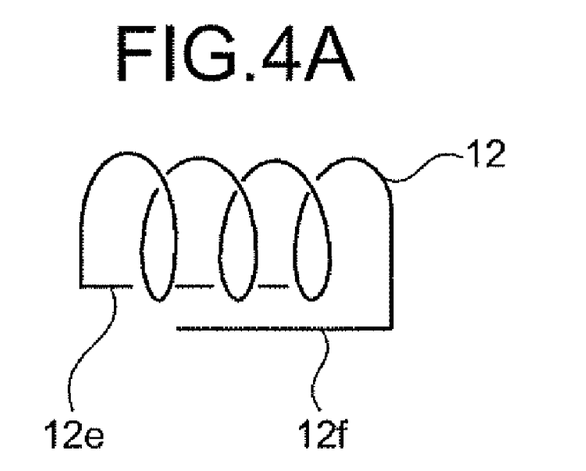
FIG. 4A is a perspective view of an unfavorable coil.
Figure 4B:
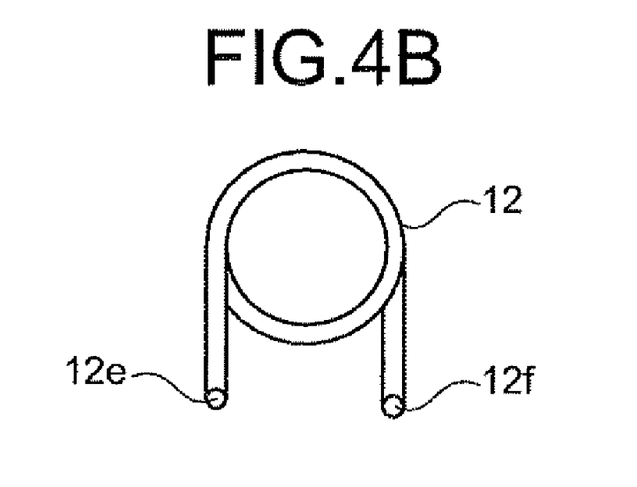
FIG. 4B is a side view of the unfavorable coil.

FIGS. 4A and 4B show end portions 12e and 12f, of the coil 12, bent in parallel to the winding axis of the coil 12. The coil 12, if having these end portions bent along the winding axis, provides poor wave emission efficiency since the directions of the magnetic flux of the end portions 12e and 12f are different from the direction of the magnetic flux of the coil 12.

Figure 5:
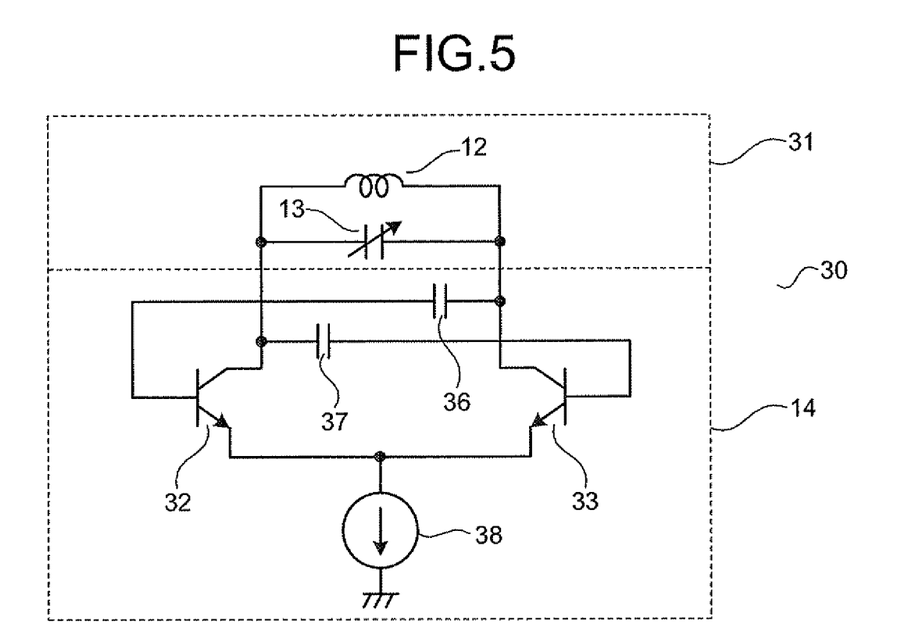
FIG. 5 is a circuit diagram of the oscillator device.

FIG. 5 is a circuit diagram of the oscillator device 30. Referring to FIG. 5, the resonator 31 includes the coil 12 and the capacitor 13 and is connected to the oscillator 14. The capacitor 13 is a variable capacitor formed from variable capacitance diodes. The resonant frequency of the resonator 31 is controlled in such a manner that a voltage is applied to the capacitor 13 from an external device (see FIG. 6).

The oscillator 14 includes a transistor 32, the collector of which is connected to one terminal of the resonator 31, a transistor 33, the collector of which is connected to the other terminal of the resonator 31, a capacitor 36 connected between the collector of the transistor 33 and the base of the transistor 32, a capacitor 37 connected between the collector of the transistor 32 and the base of the transistor 33, and a constant current source 38 which is connected to the emitter of the transistor 32 and the emitter of the transistor 33 at a connecting point and connected between the connecting point and the ground line.

As described above, the oscillator device 30 includes the resonator 31 and the oscillator 14 connected to the resonator 31. The oscillating frequency of the oscillator device 30 depends on the resonant frequency of the resonator 31. The coil 12 of the resonator 31 serves as not only a resonant inductor but also a transmitting antenna. Accordingly, the oscillation of the oscillator device 30 is also emitted from the coil 12 as electric waves.

Figure 6:
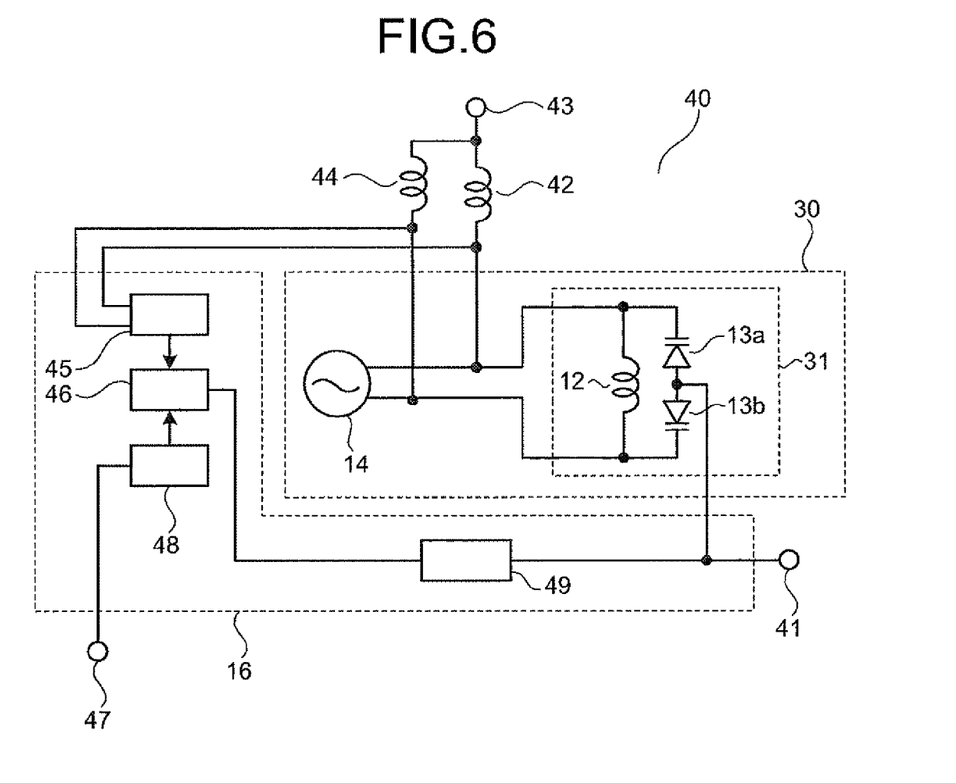
FIG. 6 is a block diagram of a transmitter module with the oscillator device.

FIG. 6 is a block diagram of the transmitter module 40 with the oscillator device 30. Referring to FIG. 6, the capacitor 13 of the resonator 31 includes variable capacitance diodes 13a and 13b which are connected to each other in serial and anodes of which are connected to each other at a connecting point connected to a data input terminal 41.

One terminal of the resonator 31 is connected to the oscillator 14 and connected to a power source terminal 43 through an inductor 42 which cuts off oscillating components (see FIG. 5). Likewise, the other terminal of the resonator 31 is connected to the oscillator 14 and connected to the power source terminal 43 through an inductor 44 which cuts off oscillating components (see FIG. 5).

The terminals of the resonator 31 are connected to the input terminals (balanced input) of a divider 45, respectively. The divided signal output from the divider 45 is supplied to one comparison input terminal of a phase comparator 46. A clock signal input to an input terminal 47, which is connected to the input terminal of the divider 48, are divided by the divider 48. The divided signal is supplied to the other comparison terminal of the phase comparator 46.

The output terminal of the phase comparator 46 is connected to the anodes of the variable capacitance diodes 13a and 13b of the resonator 31 through a low-pass filter 49. The oscillator 14, the divider 45, the phase comparator 46, and the divider 48 are integrated in an integrated circuit. The divider 45, the phase comparator 46, the divider 48, the low-pass filter 49, the input terminal 47, and the data input terminal 41 constitute the PLL circuit 16.

The following is the operation of the transmitter module 40 configured as described above. In response to frequency shift keying (FSK) data input to the data input terminal 41, the capacitance of each of the variable capacitance diodes 13a and 13b changes. The change in capacitance makes the resonant frequency of the resonator 31 change.

The change in resonant frequency makes the oscillating frequency of the oscillator 14 change (modulated). The electric waves with the changed oscillating frequency are emitted from the coil 12. A frequency of not more than 322 MHz (electric field strength 500 μV/m), which is of weak electric waves, is often used as the center frequency of the oscillating frequency in Japan. For example, a deviation from a center frequency of 300 MHz may be defined according to a data rate of "0" and "1" so that it allows FM modulation.

Figure 7:
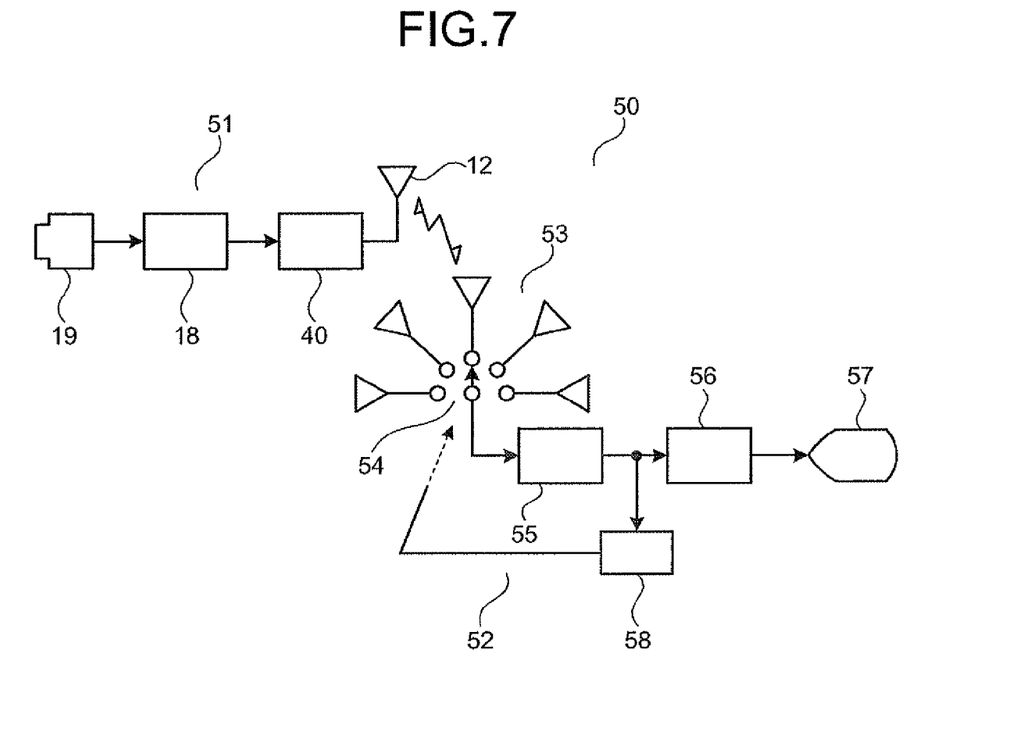
FIG. 7 is a block diagram of a medical system according to a second embodiment of the present invention.

FIG. 7 is a block diagram of a medical system 50. The medical system 50 includes the transmitter capsule 51 and a receiving device 52. The transmitter capsule 51 includes the camera 19, the controller 18 connected to the camera 19, and the transmitter module 40 connected to the output terminal of the controller 18. The transmitter module 40 also includes the oscillator device 30 according to the first embodiment. The oscillator device 30 is connected to the coil 12 having the transmitting antenna function. These components are housed in the capsule housing 21 and constitute the transmitter capsule 51.

The receiving device 52 includes multiple receiving antennas 53, a selector switch 54 connected to the receiving antennas, a receiver 55 connected to a common terminal of the selector terminal 54, a demodulator 56 connected to the output terminal of the receiver 55, a display unit 57 connected to the output terminal of the demodulator 56, and a control circuit 58 connected between the output terminal of the receiver 55 and a control terminal of the selector switch 54.

Figure 8:
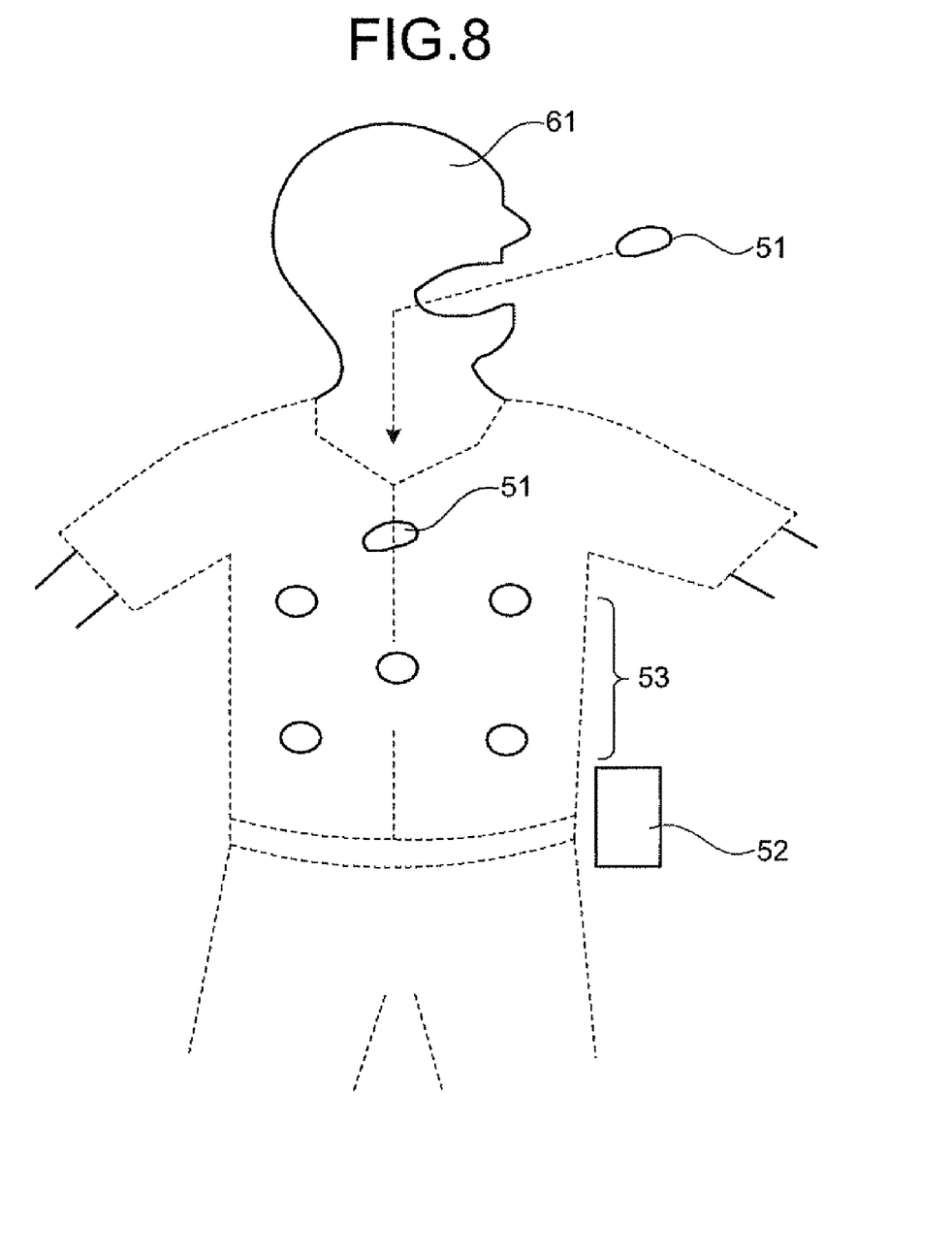
FIG. 8 shows an arrangement of the medical system on the patient.

The following is the operation of the medical system configured as described above. The transmitter capsule 51 is swallowed by a patient 61 as shown in FIG. 8. The transmitter capsule 51 goes from the mouth of the patient 61 to the organs. After that, the camera 19 takes images of the organs, and the image data is transmitted as electric waves from the transmitting antenna, i.e., the coil 12, to the outside of the patient's body.

The electric waves emitted from the transmitting antenna are received by the multiple receiving antennas 53 which are provided outside of the patient 61. The received electric waves are converted into a baseband frequency by the receiving device 55 and demodulated by the demodulator 56. The demodulated signals are displayed on the display unit 57.

The signals output from the receiving device 55 are detected by a level detector which is provided in the control circuit 58. A receiving antenna receiving large strength electric waves is selected by controlling the selector switch 54 based on the detection result.

In this way, the receiver 55 can receive the electric waves from the transmitter capsule 51 at its best sensitivity even if the transmitter capsule 51 is in any position of the patient 61. In other words, this system allows images of the patient's organs taken by the camera 19 to be displayed on the display unit 57 at high sensitivity.

Figure 9:
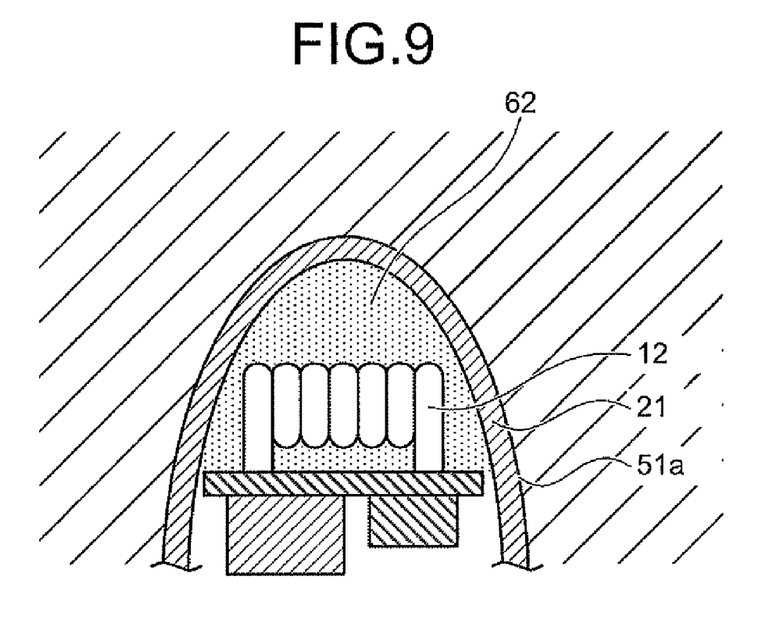
FIG. 9 is a cross-sectional view of a main part of a transmitter capsule according to a third embodiment of the present invention.

FIG. 9 is a cross-sectional view of a main part of a transmitter capsule 51a according to a third embodiment of the present invention. Referring to FIG. 9, the transmitter capsule 51a includes dielectric material 62 which fills the space around the coil 12. For example, when the coil 12 is exposed to the air in the capsule housing 21, the coil 12 is filled with a medium having a permittivity of 1. The inside of the patient's body, i.e., the outside of the transmitter capsule 51a, is filled with a medium having a permittivity of 40. In other words, there is reflection of electric waves based on the difference in permittivity between the outside and inside of the capsule transmitter 51a.

Accordingly, the dielectric material 62, if having a permittivity of much closer to the permittivity of the inside of the patient's body, i.e., 40, reduces reflection loss. However, a material with a high permittivity generally has a low Q factor. For this reason, the dielectric material 62 to be filled has a high permittivity such that the Q factor is not too low. Specifically, the dielectric material 62 preferably has a permittivity in a range from 1 to 20.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An oscillator device, comprising:
a resonator including a coil and a capacitor connected to the coil in parallel; and
an oscillator connected to the resonator, wherein
electric waves are emitted from the coil to at least one receiving antenna of the receiver while the oscillator device changes position and direction over time, and
the coil has an outer diameter and a total length parallel to a winding direction of the coil, the total length being approximately the same as the outer diameter.

2. The oscillator device according to claim 1, wherein the outer diameter is 1.2 times as large as the total length.

3. The oscillator device according to claim 1, further comprising an insulating board, wherein the insulating board has one side on which the coil is mounted and the other side on which the capacitor and the oscillator are mounted.

4. The oscillator device according to claim 1, wherein the coil has two end portions which are bent under a body of the coil, and the oscillator comprises two lands on which the end portions are mounted respectively and which extend along the end portions.

5. The oscillator device according to claim 1, comprising a dielectric material with a permittivity in a range from 1 to 40, the dielectric material filling a space around the coil.

6. The oscillator device according to claim 3, wherein only the coil is mounted on the one side of the insulating board.

7. The oscillator device according to claim 3, wherein the coil has a circular shape on a plane perpendicular to a winding axis of the coil.

8. A transmitter module, comprising:
an oscillator device;
a phase-locked loop circuit connected to the oscillator device; and
a data input terminal, wherein
the oscillator device includes
a resonator including a coil and a variable capacitance diode connected to the coil in parallel, the variable capacitance diode being connected to the data input terminal;
an oscillator connected to the resonator; and
an insulating board, the insulating board having one side on which the coil is mounted and the other side on which the capacitor and the oscillator are mounted, wherein
electric waves are emitted from the coil to at least one receiving antenna of the receiver while the oscillator device changes position and direction over time, and
the coil has an outer diameter and a total length parallel to a winding direction of the coil, the total length being approximately the same as the outer diameter.

9. The transmitter module according to claim 8, wherein further comprising:
a control unit and a camera which are mounted on the side of the insulating board; and
a separator between the oscillator and the control unit, the separator including a conductor and an insulator applied to the conductor.

* * * * *